US008174837B2

(12) United States Patent
Tracy et al.

(10) Patent No.: US 8,174,837 B2
(45) Date of Patent: May 8, 2012

(54) WIRELESS ENABLE/DISABLE LOCKING SYSTEM

(75) Inventors: Mark S. Tracy, Tomball, TX (US); Paul J. Doczy, Cypress, TX (US); Jonathan R. Harris, Cypress, TX (US); L. Joy Griebenow, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1334 days.

(21) Appl. No.: 11/796,251

(22) Filed: Apr. 27, 2007

(65) Prior Publication Data

US 2008/0266053 A1 Oct. 30, 2008

(51) Int. Cl.
*H05K 7/20* (2006.01)

(52) U.S. Cl. ........ 361/747; 361/727; 361/740; 361/759; 361/781; 361/814; 455/556.1; 713/155

(58) Field of Classification Search ............. 361/679.01, 361/679.23, 679.29, 679.4, 679.55, 679.57, 361/679.58, 727, 579.4, 740, 747, 759, 781, 361/814
See application file for complete search history.

(56) References Cited

U.S. PATENT DOCUMENTS

| | | | | |
|---|---|---|---|---|
| 4,724,537 | A | 2/1988 | Monet | |
| 5,757,616 | A * | 5/1998 | May et al. | 361/679.57 |
| 5,924,232 | A * | 7/1999 | Rhoden et al. | 42/70.11 |
| 6,122,152 | A * | 9/2000 | Goto et al. | 361/1 |
| 6,550,010 | B1 | 4/2003 | Link, II et al. | |
| 6,654,890 | B1 | 11/2003 | Girard | |
| 6,704,194 | B2 * | 3/2004 | Koo | 361/679.27 |
| 6,950,033 | B1 * | 9/2005 | Guyre | 340/687 |
| 7,146,240 | B2 * | 12/2006 | Shad | 700/136 |
| 7,181,238 | B2 * | 2/2007 | Chiang | 455/556.1 |
| 7,370,218 | B2 * | 5/2008 | Lee | 713/320 |
| 7,480,134 | B2 * | 1/2009 | Cheng | 361/679.55 |
| 7,609,514 | B2 * | 10/2009 | Doczy et al. | 361/679.58 |
| 2002/0108010 | A1 | 8/2002 | Kahler | |
| 2003/0160681 | A1 | 8/2003 | Menard | |
| 2005/0044906 | A1 | 3/2005 | Spielman | |
| 2005/0091553 | A1 | 4/2005 | Chien et al. | |
| 2005/0138356 | A1 | 6/2005 | Hurwitz | |
| 2006/0007649 | A1 | 1/2006 | Yang | |
| 2006/0164208 | A1 | 7/2006 | Schaffzin | |
| 2006/0205432 | A1 | 9/2006 | Hawkins et al. | |
| 2006/0268505 | A1 * | 11/2006 | Krah | 361/683 |

* cited by examiner

*Primary Examiner* — Courtney Smith

(57) ABSTRACT

A wireless enable/disable locking system comprises a locking element configured to physically cooperate with a switch, the switch for enabling/disabling a wireless communication capability of a device, to lock the wireless communication state of the switch to either enabled or disabled.

31 Claims, 5 Drawing Sheets

WIRELESS ENABLE/DISABLE LOCKING SYSTEM

BACKGROUND

Electronic devices, such as notebook computers, personal digital assistants, etc., are generally equipped with wireless communication capabilities for connecting to the Internet, accessing electronic mail, and other applications. These devices generally have a button or switch that is used to enable or disable the wireless capability or function of the device. For example, the Federal Aviation Administration (FAA) generally bans certain types of wireless communications while airborne. Thus, in operation, for example, the button or switch enables a user of the device to easily disable the wireless communication capability of the device while airborne while also enabling continued use of the device (e.g., use of non-wireless functions of the device). However, at least based on the locations of these switches, the wireless function of the device may be inadvertently enabled or disabled (e.g., by bumping into or inadvertently pressing the switch).

DETAILED DESCRIPTION OF THE DRAWINGS

Figure 1:
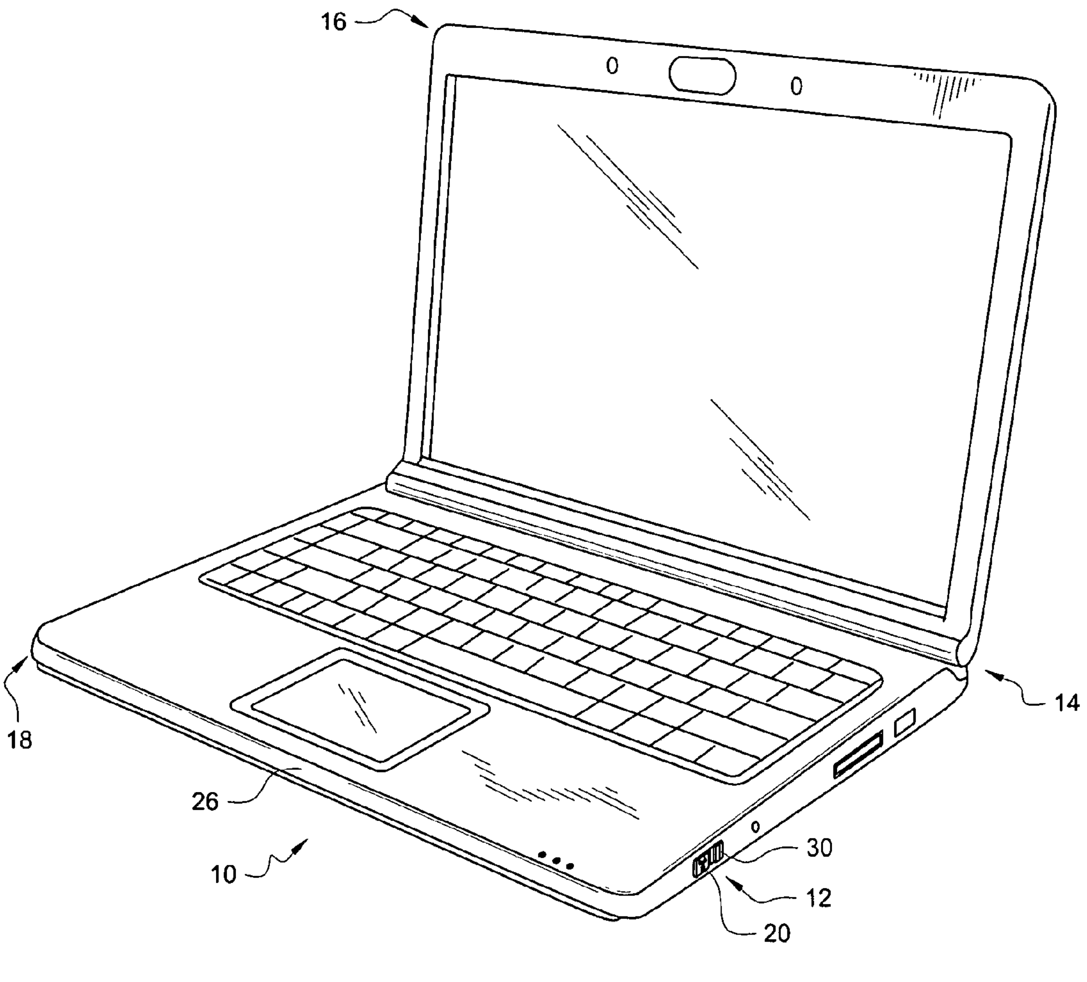
FIG. 1 is a diagram illustrating an electronic device in which an embodiment of a wireless enable/disable locking system is employed to advantage.
Figure 2:
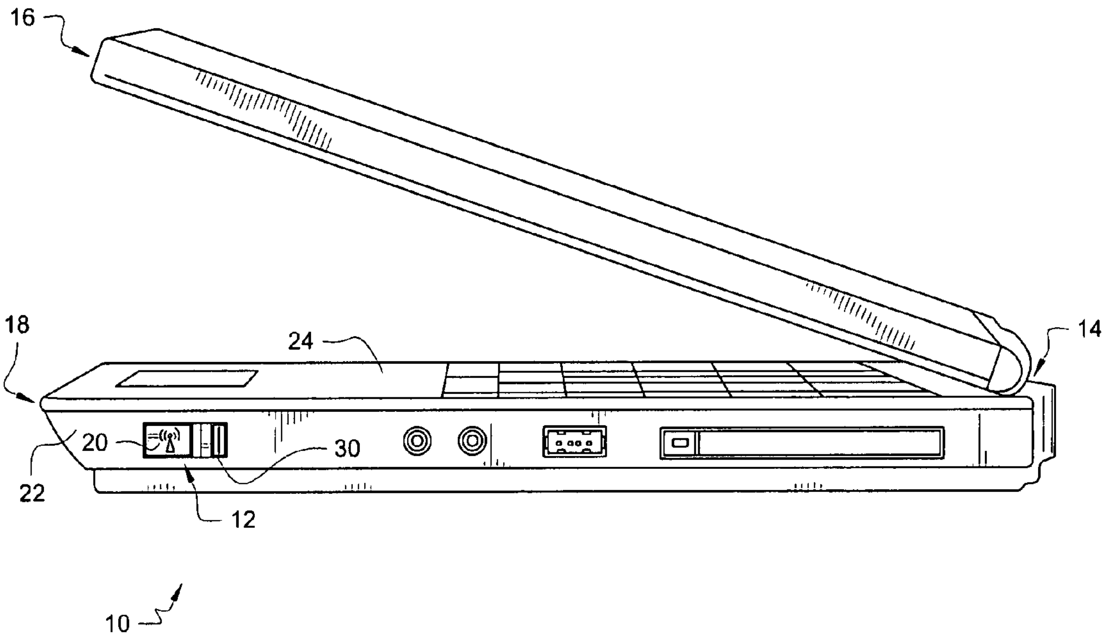
FIG. 2 is a side view of the electronic device and wireless enable/disable locking system of FIG. 1.

FIG. 1 is a diagram illustrating an electronic device 10 in which an embodiment of a wireless enable/disable locking system 12 is employed to advantage, and FIG. 2 is a diagram illustrating a side view of the electronic device of FIG. 1. In the embodiment illustrated in FIGS. 1 and 2, electronic device 10 comprises a notebook computer 14 having a display member 16 rotatably coupled to a base member 18. However, it should be understood that electronic device 10 may comprise other types of devices configured for wireless capability such as, but not limited to, a personal digital assistant (PDA), a tablet computer, a gaming device, or other type of portable or non-portable device.

In the embodiment illustrated in FIGS. 1 and 2, system 12 comprises a switch 20 for enabling/disabling a wireless communication capability or state of electronic device 10. For example, in some embodiments, switch 20 comprises an actuatable or depressable button or other type of element that a user of electronic device 10 may physically engage/actuate to enable or disable a wireless communication capability of electronic device 10. In the embodiment illustrated in FIGS. 1 and 2, switch 20 is located on a side 22 of base member 18. However, it should be understood that switch 20 may be otherwise located on electronic device 10 such as, for example, on a working platform or surface 24 of base member

18, on a front surface 26 of base member 18, on display member 16 or elsewhere on electronic device 10. In FIGS. 1 and 2, a single switch 20 is illustrated; however, it should be understood that additional switches 20 may be used on electronic device 10 for alternative and/or additional functions (e.g., power on/off, display brightness, etc.).

In the embodiment illustrated in FIGS. 1 and 2, system 12 also comprises a locking element 30 configured to lock the wireless communication state of switch 20 and/or otherwise lock the position or actuatable state of switch 20, thereby locking and/or substantially preventing an inadvertent change in the wireless communication state of electronic device 10. In the embodiment illustrated in FIGS. 1 and 2, locking element 30 is disposed adjacent switch 20 and is configured to physically cooperate with switch 20 to lock the actuatable state of switch 20. For example, in some embodiments, locking element 30 is configured to physically engage and/or otherwise prevent actuation of switch 20. Thus, for example, if the wireless communication state of electronic device 10 is currently enabled, locking element 30 prevents inadvertent actuation of switch 20 that may otherwise inadvertently disable the wireless state of electronic device 10. Correspondingly, if the wireless communication state of electronic device is currently disabled, locking element 30 is configured to prevent inadvertent actuation of switch 20, thereby substantially preventing inadvertent enabling of the wireless communication state of electronic device 10.

Figure 3A:
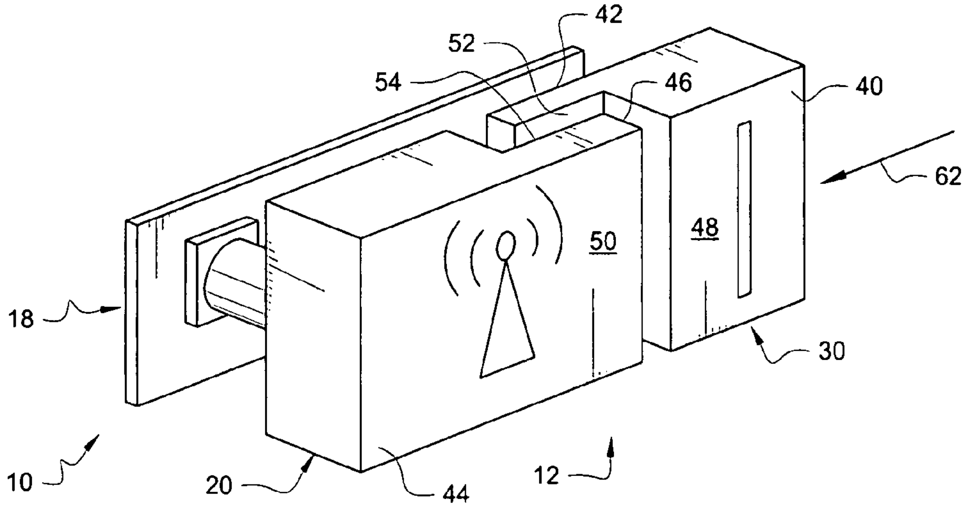
FIG. 3A is a diagram illustrating an enlarged view of the wireless enable/disable locking system of FIGS. 1 and 2 in a locked position.
Figure 3B:
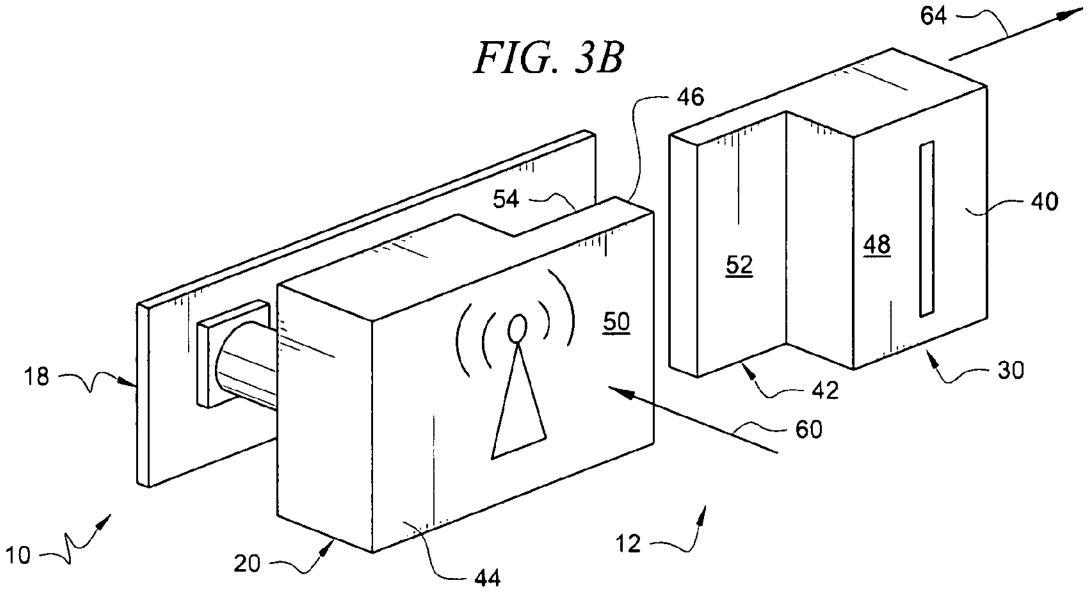
FIG. 3B is a diagram illustrating an enlarged view of the wireless enable/disable locking system of FIG. 3A in an unlocked position.

FIG. 3A is a diagram illustrating an enlarged view of an embodiment of system 12 with locking element 30 in a locked position relative to switch 20, and FIG. 3B is a diagram illustrating the embodiment of system 12 of FIG. 3A with switch 30 in an unlocked position relative to switch 20. In the embodiment illustrated in FIGS. 3A and 3B, locking element 30 comprises a main body portion 40 having an extension element 42 extending from main body portion 40 toward a location of switch 20. In the embodiment illustrated in FIGS. 3A and 3B, switch 20 comprises a main body portion 44 having an extension element 46 extending from main body portion 44 in a direction toward locking element 30. In some embodiments, extension elements 42 and 46 are configured having complementary shapes and/or geometries to facilitate engagement therewith while providing a uniform or even surface profile of switch 20 and locking element 30 adjacent each other (e.g., having forwardly-facing surfaces 48 and 50 of locking element 30 and switch 20, respectively, substantially even or lying in substantially the same plane relative to each other). However, it should be understood that locking element 30 and/or switch 20 may be otherwise configured.

In the embodiment illustrated in FIGS. 3A and 3B, locking element 30 is configured for slideable and/or translatable movement relative to electronic device 10 and/or switch 20. In FIGS. 3A and 3B, locking element 30 is configured to physically cooperate with and/or by physically positioned relative to at least a portion of switch 20 while disposed in a locking position relative to switch 20 to prevent actuation of switch 20, thereby preventing inadvertent changing of the wireless communication state of electronic device 10. For example, in the embodiment illustrated in FIGS. 3A and 3B, a forwardly-facing surface 52 of extension element 42 is configured to physically engage a rearwardly-facing surface 54 of extension element 46 to prevent actuation of switch 20. For example, in operation, switch 20 is generally actuatable and/or depressable in a rearwardly direction indicated by 60 (FIG. 3B) to change a wireless communication state of electronic device 10 (e.g., changing the wireless communication state of electronic device 10 from enabled to disabled or from disabled to enabled). In FIG. 3A, locking element 30 is illustrated in a locking position such that locking element 30 is in physical engagement with or in a position to physically engage switch 20 to prevent movement of switch 20 in the direction indicated by 60 (FIG. 3B). For example, in FIG. 3A, forwardly-facing surface 52 is located in a position in close proximity or contacting rearwardly-facing surface 54 of switch 20, thereby preventing movement of switch 20 in the direction indicated by 60 (FIG. 3B). However, it should be understood that the form of cooperation and/or a position of locking element 30 relative to switch 20 to prevent actuation of switch 20 may be otherwise configured (e.g., locking element 30 may be configured to extend over and/or otherwise cover all or at least a portion of switch 20 to prevent actuation thereof, locking element 30 may be configured to be depressed and slid and/or otherwise moved into a position relative to switch 20 to prevent actuation of switch 20, etc.).

As used herein, the locking position of locking element 30 relative to switch 20 resulting in physical "engagement" of locking element 30 with switch 20 may include actual physical contact with switch 20 when in the locking position (e.g., extension element 46 in physical contact with extension element 42) or locking element 30 in a position to physically engage switch 20 in response to slight movement of switch 20 in the direction 60 (e.g., in a position relative to switch 20 to prevent movement of switch 20 in the direction 60 to the extent necessary to change a wireless communication state of electronic device 10). For example, forwardly-facing surface 52 may be disposed facing rearwardly-facing surface 56 having a small gap therebetween such that, even though switch 20 may be slightly movable in the direction indicated by 60, the amount of movement of switch 20 in the direction indicated by 60 is insufficient to effectuate a change in a wireless communication state of electronic device 10. However, it should be understood that locking element 30 may be otherwise configured to prevent inadvertent physical actuation of switch 20.

In some embodiments, locking element 30 is biased in the direction indicated by 62 in FIG. 3A such that locking element 30 is biased into the locking position relative to switch 20. In this embodiment, to change a wireless communication state of electronic device 10, locking element 30 is moved in the direction indicated by 64 in FIG. 3B against the biasing force until extension element 42 is located in a position relative to switch 20 that enables movement of switch 20 in the direction indicated by 60. Thus, after actuation of switch 20 to change a wireless communication state for electronic device 10, in response to a user releasing locking element 30, locking element 30 returns to a locking position relative to switch 20 (e.g., as illustrated in FIG. 3A).

Figure 4:
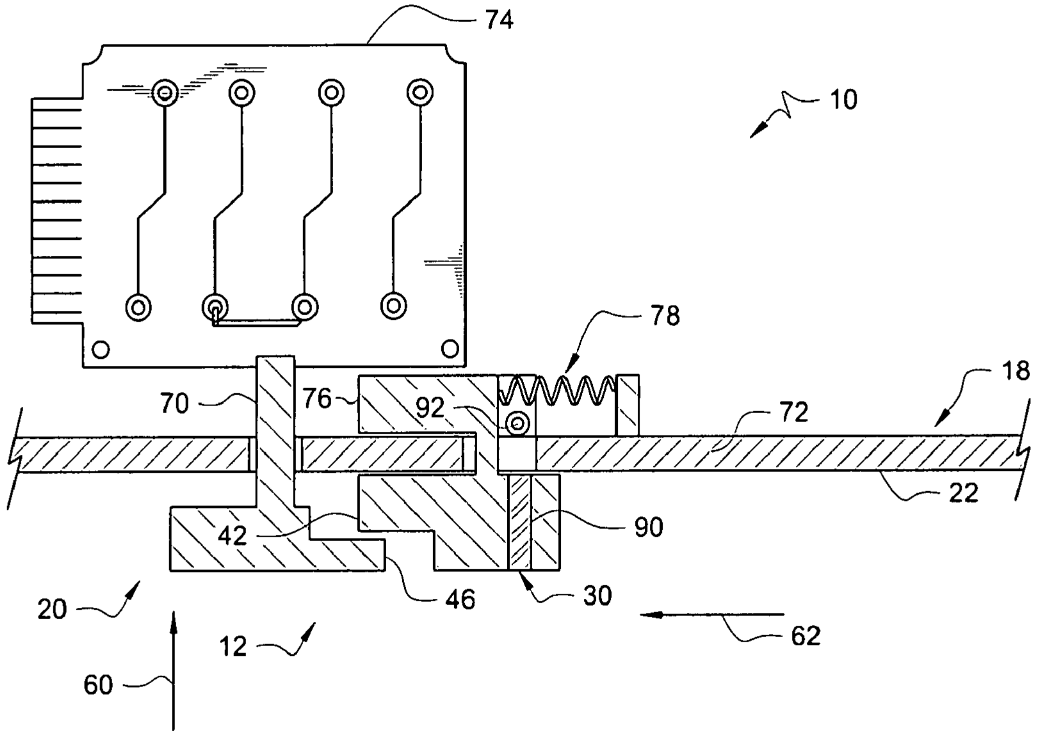
FIG. 4 is a diagram illustrating a top view of the wireless enable/disable locking system of FIGS. 3A and 3B in a locked position.

FIG. 4 is a diagram illustrating a top view of system 12 of FIGS. 3A and 3B with portions of electronic device 10 removed from view. In the embodiment illustrated in FIG. 4, switch 20 comprises a portion 70 extending through a wall 72 of base member 18 to couple switch 20, either directly or indirectly, to a wireless module 74 to facilitate, by engagement with switch 20 or otherwise, enablement or disablement of a wireless communication state of electronic device 10. In the embodiment illustrated in FIG. 4, locking element 30 comprises a portion 76 extending through wall 72 of base member 18 and disposed in engagement with a biasing element 78. In operation, biasing element 78 is configured to bias locking element 30 in the direction indicated by 62 such that locking element 30 is biased into a locking position relative to switch 20 to prevent actuation of switch 20. For example, as illustrated in FIG. 4, locking element 30 is illustrated as being biased into a position relative to switch 20 such that extension element 42 is positioned rearwardly of extension element 46 of switch 20 to prevent actuation of switch 20 in the direction indicated by 60. Biasing element 78 may comprise a spring, flexible clip, elastic member or any other type of device for biasing locking element 30 in the direction 62.

Figure 5A:
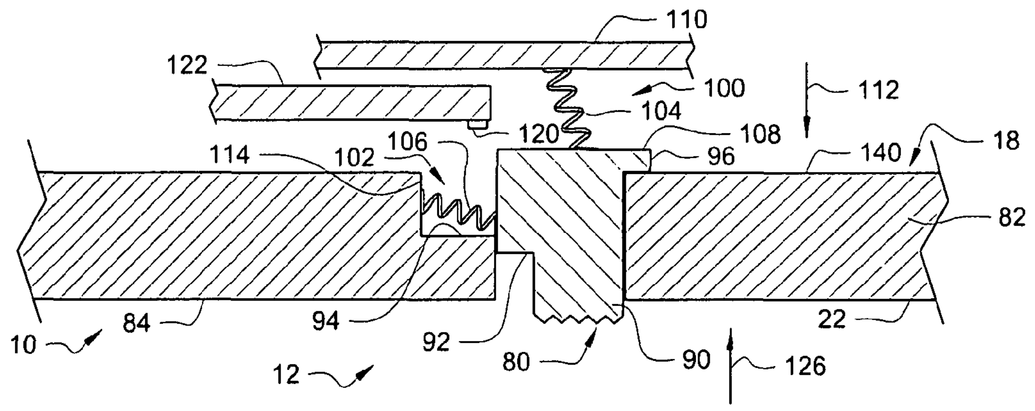
FIGS. 5A and 5B are additional diagrams illustrating an embodiment of a wireless enable/disable locking system.
Figure 5B:
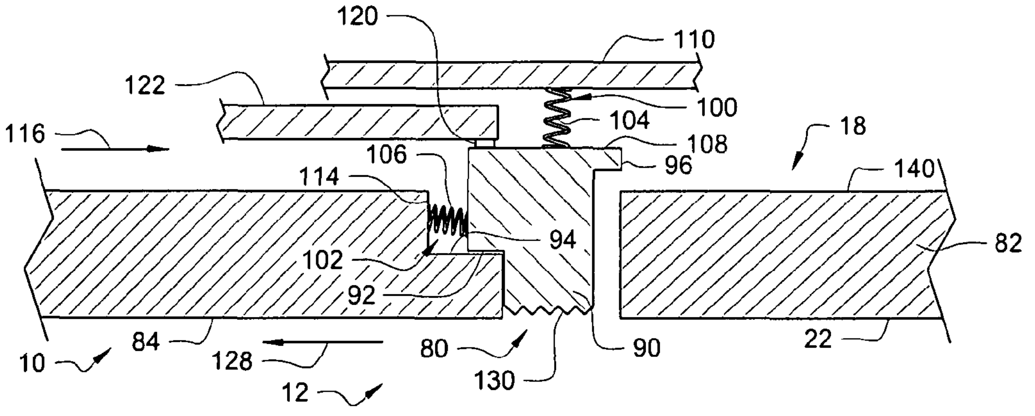

FIGS. 5A and 5B are additional diagrams illustrating an embodiment of wireless enable/disable locking system 12. In the embodiment illustrated in FIGS. 5A and 5B, locking system 12 comprises a locking element 80 slidably disposed relative to a wall 82 of a housing 84 of base member 18. In the embodiment illustrated in FIGS. 5A and 5B, locking element 80 comprises a body portion 90 having an extension 92 disposed on a side thereof for engaging a corresponding step 94 formed in and/or otherwise disposed on wall 82 of housing 84. In FIGS. 5A and 5B, body portion 90 also comprises an extension 96 disposed on a side of body portion 90 opposite the location of extension 92.

In the embodiment illustrated in FIGS. 5A and 5B, system 12 comprises biasing elements 100 and 102 in the form of springs 104 and 106, respectively. However, it should be understood that other types of biasing mechanisms may be used. In operation, biasing mechanism 100 is coupled between an internal surface 108 of body portion 90 and a support 110 to bias locking element 80 outwardly relative to housing 84 in the direction indicated by arrow 112. Biasing element 102 is coupled between extension 92 and a portion 114 of housing 84 adjacent step 94 to bias locking element 80 in the direction indicated by arrow 116. In the embodiment illustrated in FIGS. 5A and 5B, system 12 also comprises a switch 120 coupled to a support 122, such as a printed circuit board (PCB).

In operation, FIG. 5A illustrates a position of locking element 80 when a wireless capability of electronic device 10 is in an enabled state. To disable the wireless capability of electronic device 10 and lock the disabled state of the wireless capability, locking element 80 is pushed inwardly in the direction indicated by arrow 126 against the biasing force of biasing element 100. Additionally, locking element 80 is slidable in the direction indicated by arrow 128 against the biasing force of biasing element 102. In response to movement of locking element 80 in the directions indicated by arrows 126 and 128, extension 92 is located in a position relative to step 94 such that in response to a release of locking element 80, extension 92 is biased against step 94 by biasing element 100, thereby securing the position of locking element 80 relative to housing 84. Further, in response to movement of locking element 80 in the direction indicated by arrow 126, surface 108 of locking element engages and/or otherwise actuates switch 120 which is configured to turn off or disable the wireless capability of electronic device 10 when actuated. Additionally, as illustrated in FIG. 5B, when locking element 80 is located in a position to disable the wireless capability of electronic device 10, a surface 130 is disposed flush (flush or substantially flush) or even slightly sub-flush relative to side 22 of housing 84, thereby substantially preventing inadvertent contact with locking element 80 that may otherwise inadvertently enable the wireless capability of electronic device 10.

Correspondingly, to enable the wireless capability of electronic device, locking element 80 is pressed inwardly slightly to disengage and/or otherwise separate extension 92 from step 94. Biasing element 102 causes locking element 80 to move in the direction indicated by arrow 116, and biasing element 100 causes locking element 80 to move in the direction indicated by arrow 112, thereby causing the de-actuation of switch 120 and the enabling of the wireless capability of electronic device 10. In the embodiment illustrated in FIGS. 5A and 5B, extension 96 is configured to engage an internal surface 140 of wall 82 of housing 84 to prevent over-extension and/or otherwise limit outward movement of locking element 80. However, it should be understood that locking element 80 may be otherwise configured.

Thus, embodiments of system 12 substantially prevent inadvertent enablement or disablement of a wireless communication state of electronic device 10, thereby ensuring compliance with particular wireless communication regulations and/or otherwise preventing inadvertent actuation of switch 20. It should be understood that locking element 30 may also be associated with locking other functions of electronic device 10 (e.g., if associated with a power-related switch 20, preventing inadvertent turning on or turning off of electronic device 10). In some embodiments, electronic device 10 is configured to visibly indicate the locking position or state thereof. For example, referring to FIG. 4, in the illustrated embodiment, locking element 30 is configured having a lightpipe or lightguide 90 disposed therein configured to be aligned with a light emitting diode (LED) 92 or other type of illumination element when locking element 30 is disposed in a locking position. Thus, in operation, when locking element 30 is disposed in the locking position, light from LED 92 is transmitted through lightguide 90 and emitted therefrom, thereby providing a visual indication of the locked state of locking element 30 and a related switch 20. In some embodiments, LED 92 is disposed on a portion of locking element 30 and moves with locking element 30 such that when locking element 30 is located in a locking position, LED 92 is moved into an aligned position with lightguide 90. This, in this example, when locking element 30 is moved to an unlocked position, side 22 effectively blocks light from LED 92 from being emitted through lightguide 90. It should be understood that the illumination of LED 92 may also be controlled (e.g., illuminated when in a locking position and turned off when moved to an unlocked position, turned on/off based on an enable/disable state of a wireless module of electronic device 10. etc.). However, it should be understood that other methods or devices may be used to provide a visual indication of the locked state of locking element 30 and a related switch 20 (e.g., a color-coded area disposed on electronic device 10 and/or locking element 30 indicating whether locking element 30 is in a locked or unlocked position, etc.). It should also be understood that the above-described visual indictors or others may be incorporated and/or otherwise used with locking element 80 illustrated in FIGS. 5A and 5B.

What is claimed is:

1. A wireless enable/disable locking system, comprising:

a switch moveable between a first position and a second position, the switch in the first position to enable wireless communication of an electronic device and the switch in the second position to disable the wireless communication of the electronic device; and a locking element moveable between locking element positions to physically cooperate with the switch and to lock the switch to prevent the switch from moving from the second position to the first position.

2. The system of claim 1, wherein the locking element comprises a biased locking mechanism.

3. The system of claim 1, wherein the locking element is configured to be biased into engagement with the switch.

4. The system of claim 1, wherein the locking element is configured for slideable movement relative to the switch.

5. The system of claim 1, wherein a forwardly-facing portion of the locking element is configured to engage a rearwardly-facing portion of the switch.

6. The system of claim 1, wherein at least a portion of the locking element is configured to engage at least a portion of the switch to prevent movement of the switch to the first position.

7. The system of claim 1, wherein the locking element is movable away from engagement with the switch to enable actuation of the switch from the second position to the first position.

8. The system of claim 1, wherein the locking element is configured to visually indicate a locked position thereof relative to the switch.

9. An electronic device, comprising:

a switch actuatable between a first position and a second position, the switch in the first position providing a first state in which wireless communication of an electronic device is enabled, and the switch in the second position providing a second state in which the wireless communication of the electronic device is disabled; and a locking element moveable between locking element positions to engage the switch to lock the switch in the second position corresponding to the second state.

10. The electronic device of claim 9, wherein:

the locking element includes a body and an extension; and the switch includes a body and an extension, the extension of the locking element having a complementary shape to the extension of the switch.

11. The electronic device of claim 9, wherein the locking element is to engage the switch to prevent inadvertent changing of the switch from the second position to the first position.

12. The electronic device of claim 9, wherein the locking element is to physically contact the switch to prevent the switch from moving.

13. The electronic device of claim 9, wherein the locking element is biased against the switch to lock the switch in the second position.

14. A method for manufacturing a wireless enable/disable locking system, comprising:

providing a switch actuatable between a first position and a second position, the switch in the first position to enable a wireless communication of an electronic device, and the switch in the second position to disable the wireless communication of the electronic device; and providing a locking element configured to physically cooperate with the switch, the locking element moveable between locking element positions to lock the switch in the second position to disable the wireless communication of the electronic device.

15. The method of claim 14, wherein providing the locking element comprises providing a biased locking mechanism.

16. The method of claim 14, further comprising configuring the locking element to be in biased engagement with the switch.

17. The method of claim 14, further comprising configuring a forwardly-facing portion of the locking element to engage a rearwardly-facing portion of the switch.

18. The method of claim 14, further comprising configuring at least a portion of the locking element to engage at least a portion of the switch to prevent movement of the switch from the second position to the first position.

19. The method of claim 14, further comprising configuring the locking element to be movable away from biased engagement with the switch to enable actuation of the switch from the second position to the first position.

20. A wireless enable/disable locking system, comprising:

a switch actuatable to a first position that enables a wireless communication capability of an electronic device and actuatable to a second position that disables the wireless communication capability of the electronic device; and a locking element moveable between locking element positions to lock the switch to prevent the switch from moving from the second position to the first position.

21. The system of claim 20, wherein the locking element is configured to be biased against the switch.

22. An electronic device, comprising:

a physically actuatable switch that moves between a first position to enable wireless communication of the electronic device and a second position to disable the wireless communication of the electronic device; and a locking element disposed adjacent the switch and moveable into a locked position relative to the switch to prevent actuation of the switch.

23. A wireless enable/disable locking system, comprising:

a switch actuatable to a first position to enable wireless communication of an electronic device and to a second position to disable the wireless communication of the electronic device; and a locking element moveable between locking element positions to lock the switch and to prevent the switch from being moved from the second position to the first position, to maintain the wireless communication disabled.

24. The system of claim 23, wherein the locking element is slidably coupled to a housing of the electronic device.

25. The system of claim 23, wherein the locking element is engageable with a housing of the electronic device.

26. The system of claim 1, wherein the switch in the first position causes the switch to engage a wireless module of the electronic device to enable the wireless communication.

27. The system of claim 1, wherein the switch is depressible from the second position to the first position, and wherein the locking element when physically engaged with the switch prevents the switch from being depressed from the second position to the first position.

28. The electronic device of claim 9, further comprising a wireless module to perform the wireless communication, wherein the switch in the first position causes the switch to engage the wireless module to enable the wireless communication, and wherein the switch in the second position causes the switch to be disengaged from the wireless module to disable the wireless communication.

29. The electronic device of claim 9, wherein the switch is depressible from the second position to the first position, and wherein the locking element when physically engaged with the switch prevents the switch from being depressed from the second position to the first position.

30. The method of claim 14, wherein the switch in the first position causes the switch to engage a wireless module of the electronic device to enable the wireless communication, and wherein the switch in the second position causes the switch to disengage from the wireless module to disable the wireless communication.

31. The system of claim 23, wherein the switch in the first position causes the switch to engage a wireless module of the electronic device to enable the wireless communication, and wherein the switch in the second position causes the switch to be disengaged from the wireless module to disable the wireless communication.

* * * * *